(12) United States Patent
Siegler et al.

(10) Patent No.: US 7,274,240 B2
(45) Date of Patent: Sep. 25, 2007

(54) CLOCK CONTROL CELL

(75) Inventors: Sascha Siegler, Unterhaching (DE);
Gerhard Weber, Ottobrunn (DE);
Thomas Baumann, Aschheim (DE);
Stefan Bergler, München (DE)

(73) Assignee: Infineon Technologies AG, Munich (DE)

( * ) Notice: Subject to any disclaimer, the term of this patent is extended or adjusted under 35 U.S.C. 154(b) by 65 days.

(21) Appl. No.: 11/158,188

(22) Filed: Jun. 21, 2005

(65) Prior Publication Data

US 2006/0001468 A1    Jan. 5, 2006

(30) Foreign Application Priority Data

Jun. 30, 2004    (DE)    ........................ 10 2004 031 669

(51) Int. Cl.
*G06F 1/04* (2006.01)
(52) U.S. Cl. ........................ 327/291; 327/299
(58) Field of Classification Search .................... None
See application file for complete search history.

(56) References Cited

U.S. PATENT DOCUMENTS

| | | | |
|---|---|---|---|
| 5,537,062 A * | 7/1996 | Mote, Jr. ........................ 326/93 |
| 5,808,486 A * | 9/1998 | Smiley ........................ 327/34 |
| 6,204,695 B1 * | 3/2001 | Alfke et al. .................. 326/93 |
| 6,232,845 B1 * | 5/2001 | Kingsley et al. .............. 331/57 |
| 6,242,960 B1 * | 6/2001 | Bae .............................. 327/299 |
| 6,318,911 B1 | 11/2001 | Kitahara |
| 6,552,572 B1 | 4/2003 | Cheung et al. |
| 6,724,225 B2 * | 4/2004 | Joshi et al. .................. 326/113 |
| 6,992,517 B2 * | 1/2006 | Weiner ........................ 327/176 |
| 7,034,577 B2 * | 4/2006 | Kawasumi .................. 326/104 |

FOREIGN PATENT DOCUMENTS

| | | |
|---|---|---|
| DE | 1127944 | 6/1971 |
| EP | 0991074 A1 | 4/2000 |
| EP | 1267249 A2 | 12/2002 |

* cited by examiner

*Primary Examiner*—Tuan T. Lam
(74) *Attorney, Agent, or Firm*—Eschweiler & Associates, LLC

(57) ABSTRACT

A clock control cell for production of an output clock signal from an input clock signal has a hold element and an output stage. The hold element is preceded by a signal level converter, with the signal level converter designed such that it converts an input signal to an output signal at predetermined signal levels, wherein the input clock signal is the input signal of the signal level converter.

12 Claims, 2 Drawing Sheets

CLOCK CONTROL CELL

REFERENCE TO RELATED APPLICATIONS

This application claims the benefit of the priority date of German application DE 10 2004 031 669.4, filed on Jun. 30, 2004, the contents of which are herein incorporated by reference in their entirety.

FIELD OF THE INVENTION

The invention relates to a clock control cell to which signals at undefined voltage levels can be applied without resulting in parallel currents in the clock control cell.

BACKGROUND OF THE INVENTION

The integration density, that is to say the number and density of the components used in integrated circuits, is increasing to an ever greater extent in semiconductor technology. Furthermore, leakage currents are becoming ever greater with the new semiconductor technologies. In order to limit the power consumption and the heat developed by integrated circuits, concepts must therefore be found to limit the power consumption of integrated circuits.

For this purpose, it is known for the clock signal to be masked out or switched off in areas, blocks or register banks of the integrated circuit in which it is temporarily not used, in order to reduce or completely suppress the switching activity and the switching currents associated with it in these unused blocks. In principle, a simple AND gate (NAND gate with an inverter) would be sufficient for this purpose, by means of which a clock signal that is applied to a first input can be masked out by means of an enable signal which is applied to a second input. However, the enable signal is not synchronized to the clock signal so that, when the clock signal is enabled and masked out, the switching of the enable signal generally results in additional flanks (glitches) occurring in the clock signal at the output of the AND gate.

The use of a clock control cell (gated clock cell) as illustrated in FIG. 1 is known in order to synchronize the enabling and masking out of clock signals. The output stage 1, which comprises a NAND gate NAND and an inverter 11, is preceded by a hold element (latch) 2, which synchronizes the unsynchronized enable signal EN to the input clock signal CLK1. The output signal from the hold element 2 changes its value only when the input clock signal CLK1 assumes the logic value 0. At this time, the output signal from the output stage 1 remains at the logic level 0 when changes occur in the output signal from the hold element 2, and no additional flanks (glitches) occur in the output clock signal CLK2.

Relatively recent developments in particular are intended to have the capability to switch off the supply voltage, or to match the supply voltage to the instantaneous voltage required, corresponding to the instantaneous task of the block, that is to say in general to reduce it, in areas and/or blocks which are temporarily not used.

Any change in the supply voltage to a block results in correspondingly changed voltage levels of the logic values within this block, since the voltage levels are generally defined as a function of the supply voltage. Normally, the voltage level of the logic one is identical to the supply voltage, and the voltage level of the logic zero is identical to ground.

The supply voltages for different blocks in this case are intended to be varied or switched off independently of one another. In consequence, by way of example in blocks which are connected to one another, identical logic signals are represented by different voltage levels. Thus, in the general case, the voltage levels of the logic signal values for one block represent undefined signal values for the respective other block. Furthermore, voltages which represent the logic signal value one fall only slowly after a block has been switched off, and during this time period thus form undefined logic signal values for an adjacent block. This can lead to very high parallel or short-circuit currents in the adjacent block, associated with a large power consumption and a large amount of heat. Particularly in logic CMOS circuits, the parallel current disappears only when the voltage levels of the input signals are outside a specific voltage range, which is located between the voltage levels of the logic signal values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a clock control cell to which undefined, logic signal values can be applied without causing parallel currents within the clock control cell and, in particular, avoiding additional flanks (glitches) on the clock signal.

A clock control cell is disclosed according to the invention, and produces an output clock signal from an input clock signal, and comprises a hold element for production of a controlled enable signal from an input enable signal. The cell also includes an output stage for production of the output clock signal from the input clock signal and the controlled enable signal, wherein the hold element is preceded by a signal level converter, with the signal level converter being designed such that it converts an input signal to an output signal, and the input clock signal being the input signal of the signal level converter. The output signal from the signal level converter in this case has predetermined signal levels, that is to say it assumes only one of a defined set of permissible signal levels at any given time.

The signal level converter in one example converts signals at possibly undefined signal levels to defined signal levels. Defined signal levels are thus applied to the hold element at all times in this example. Parallel currents within the hold element are thus suppressed.

In a conventional clock control cell, parallel or short-circuit currents can flow at least at the input of the hold element when an input clock signal with undefined voltage levels is applied. In the clock control cell according to the invention, such currents are avoided by the provision of the signal level converter. This is particularly advantageous when a clock path of an integrated circuit passes through various blocks, and the various blocks of the integrated circuit are operated or switched off by different supply voltages.

In one advantageous embodiment of the clock control cell according to the invention, the signal level converter comprises a controllable unit for suppression of parallel currents.

This unit is designed to suppress parallel currents within the signal level converter as required.

In one embodiment of the invention, the apparatus for suppression of parallel currents is part of the signal level converter, or in general is part of a logic circuit, and is controlled by a control signal. When the apparatus for suppression of parallel currents is driven in a suitable manner, the input signals to the logic circuit can assume any desired voltage levels, including undefined voltage levels, without this causing parallel currents within the logic circuit.

In a further advantageous embodiment of the clock control cell according to the invention, this clock control cell comprises an input stage which comprises the signal level converter and a control unit. The control unit in this case controls the unit for suppression of parallel currents in the signal level converter as a function of the input enable signal.

When the clock control cell is switched off by the input enable signal, then the control unit in the input stage produces a suitable control signal for the unit for suppression of parallel currents in the signal level converter. The input signals in the signal level converter can then assume any desired voltage levels without this causing parallel currents within the signal level converter.

In a further advantageous embodiment of the clock control cell according to the invention, the control unit additionally controls the unit for suppression of parallel currents in the signal level converter as a function of the controlled enable signal. This ensures that any change in the output signal from the signal level converter is synchronized to the input clock signal in such a way as to avoid additional flanks (glitches) in the output clock signal.

The output stage, which comprises at least one further logic circuit, has in one example a further unit for suppression of parallel currents within the output stage.

This also allows undefined signal levels, such as those which can occur in particular in the input clock signal, to be applied to the output stage without causing parallel currents in the output stage. The unit for suppression of parallel currents within the output stage is in this example part of a logic circuit at the input of the output stage.

A further advantageous embodiment of the clock control cell according to the invention provides for the input clock signal to be applied exclusively to those logic circuits which have a unit for suppression of parallel currents. This measure ensures that parallel currents are suppressed throughout the entire clock control cell according to the invention when undefined voltage levels occur in the input clock signal.

Another advantageous embodiment of the clock control cell according to the invention provides that a unit for suppression of parallel currents in each case comprises a controllable switching unit, which can interrupt or prevent the current flow between two common fixed potentials. A control signal which is supplied to the controllable switching unit in this case controls the interruption or prevention of the current flow or, respectively, the interruption of the current paths in the respective logic circuit through the switching unit. All of those units for suppression of parallel currents which are provided in the clock control cell according to the invention are, in one example, in the form of a controllable switching unit.

The switching unit thus suppresses any possible current flow between the two potentials within a logic circuit. If the current paths are interrupted, then the input signals to the logic circuit can assume any desired voltage levels, including undefined voltage levels, without causing parallel currents within the logic circuit.

The two common fixed potentials may be, for example, ground potential and the supply potential for the logic circuit.

In one example, in logic circuits having an apparatus for suppression of parallel currents, all the current paths, that is to say all the feasible paths via which a current can flow from the first common fixed potential, in particular the supply potential, of the logic circuit to the second common fixed potential, in particular the ground potential, pass through the switching unit. The switching unit is thus connected in series with the other components in the respective current path, in all of the current paths. This switching unit can thus interrupt the current flow in all of the current paths, and can thus interrupt the overall current flow within the logic circuit from the supply potential to the earth potential. The switching unit in this case has at least one switching element or a switch, for example a switching transistor. If the switching unit has two or more switching elements, then they are switched at the same time. In the simplest case, the switching unit comprises one and only one switching element, for example a switching transistor, through which all of the current paths in the logic circuit pass. This ensures the interruption of all the current paths and thus the suppression of possible parallel or short-circuit currents.

Furthermore, the output signal in the logic circuit is constant when the control signal for the unit for suppression of parallel currents causes its switching unit to interrupt all of the current paths. The logic input signals in this case have no influence on the output signal from the logic circuit. This minimizes switching activities and the switching currents associated with them within the logic circuit, and in downstream circuit elements. The control signal thus represents a signal which is at a higher level than the logic input signals. In particular, in this case, the output signal from the logic circuit has a defined signal level.

The logic circuit with a unit for suppression of parallel currents may be formed in one example in a particularly simple manner as a NAND or NOR gate. This allows a particularly simple configuration of the logic circuit. The apparatus for suppression of parallel currents in this case comprises a first of the series-arranged switching transistors. The control signal then forms an input signal for the gate, in particular that which controls the first of the series-arranged switching transistors.

When a NAND gate is used for suppression of parallel currents, the control signal or one of the logic input signals is set to a logic zero. In consequence, all of the current paths within the NAND gate are interrupted, and parallel or short-circuit currents are suppressed. The logic output signal assumes the logic value one irrespective of the possibly undefined voltage levels of the other logic input signals.

In the case of a NOR gate for suppression of parallel currents, the control signal or one of the logic input signals is set to a logic one. In consequence, all current paths within the NOR gate are interrupted, and parallel or short-circuit currents are suppressed. The logic output signal assumes the logic value zero irrespective of the possibly undefined voltage levels of the other logic input signals.

According to a further advantageous embodiment of the clock control cell, the output clock signal that is produced has flanks which are exclusively synchronous with respect to the input clock signal. The output clock signal is derived from the input clock signal, and the output clock signal is switched on and off as a function of the input clock signal, and is synchronized to it. If it is intended to emit an output clock signal, then, in the simplest case, the input clock signal is used essentially directly as the output clock signal. If it is not intended to emit any output clock signal, the output of the clock control cell according to the invention remains at a constant signal level. The change from the switched-on state to the switched-off state and back is thus carried out in such a way that the output clock signal has no more flanks than the input clock signal. If the output clock signal is switched off at times, the same number of falling and rising flanks of the input clock signal are masked out. If the output clock signal is switched off, then the input clock signal may assume any desired voltage levels without causing parallel currents in the clock control cell according to the invention.

In particular, in one example the output clock signal assumes a constant signal level at the latest on the next flank of the input clock signal when the input enable signal switches off the clock control cell and the clock.

The clock control cell according to the invention offers a functionality corresponding to that of the conventional clock control cell. In addition, it offers the advantage that no parallel or short-circuit currents flow within the logic circuits in the clock control cell according to the invention when the applied input clock signals are at undefined voltage levels.

In order to avoid additional flanks on the clock path, the clock signal is switched off in synchronism with the clock signal in the input and output stages. In contrast, the input stage is switched on asynchronously in order that the circuit-internal clock and the control signal are still available for the hold element. The output stage is enabled in synchronism with the input clock signal. This is ensured by the input stage.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text with reference to a number of drawing figures, in which.

DETAILED DESCRIPTION OF THE INVENTION

Figure 2A:
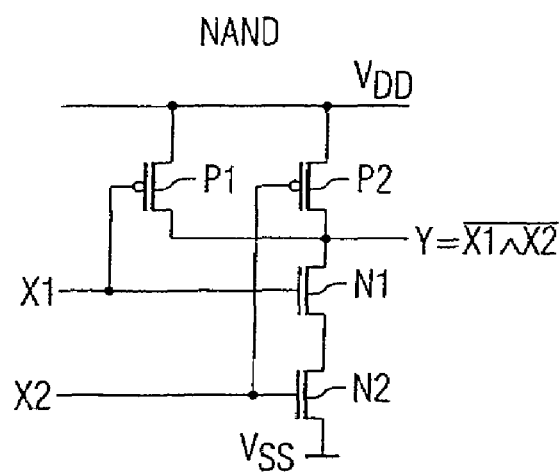
FIG. 2a is a schematic diagram illustrating a NAND gate using CMOS technology as a first exemplary embodiment of a logic circuit with a unit for suppression of parallel currents.

FIG. 2a shows a first exemplary embodiment of a logic circuit with a unit for suppression of parallel currents in the form of a NAND gate using CMOS technology. Although the illustrated NAND gate has two inputs X1 and X2, the invention can also be applied to NAND gates having any desired number of inputs. The NAND gate comprises PMOS transistors P1 and P2 connected in parallel, and NMOS transistors N1 and N2 connected in series. The NAND gate has two current paths. The first current path comprises the transistors P1, N1 and N2. The second current path comprises the transistors P2, N1 and N2. All the current paths through the NAND gate thus run through the two NMOS transistors N1 and N2. The unit for suppression of parallel currents is formed by one of the two NMOS transistors N1 and N2.

The following text is based on the assumption that NMOS transistor N2 represents the unit for suppression of parallel currents. If a logic zero is applied to the input X2, then the current paths in the NAND gate are opened. Parallel currents, that is to say currents between the supply potential $V_{DD}$ and the ground potential $V_{SS}$, can thus not flow irrespective of the voltage level at the input X1. As long as a logic zero is applied to the input X2, a logic one is produced constantly at the output Y of the NAND gate.

Figure 2B:
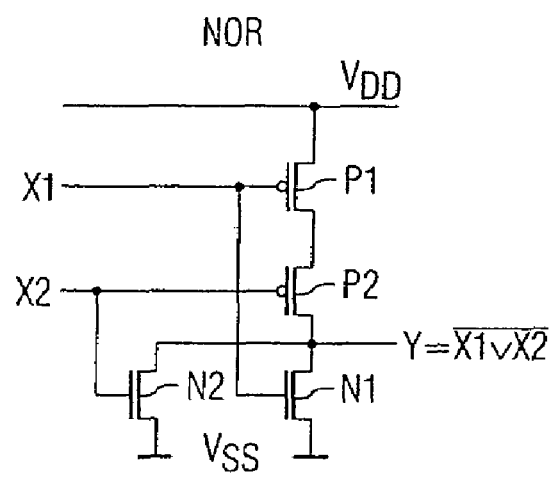
FIG. 2b is a schematic diagram illustrating a NOR gate using CMOS technology as a second exemplary embodiment of a logic circuit with a unit for suppression of parallel currents.

FIG. 2b is a NOR gate which represents a second exemplary embodiment of a logic circuit with a unit for suppression of parallel currents. The current paths through the NOR gate may in this case be interrupted by the PMOS transistors P1 and P2 connected in series, for example by the PMOS transistor P2 which is controlled by the input signal X2. When a logic one is applied to the input X2, the PMOS transistor P2 is then opened and any parallel or short-circuit currents are interrupted irrespective of the voltage level at the input X1. A logic zero is then produced at the output Y of the NOR gate.

Figure 3:
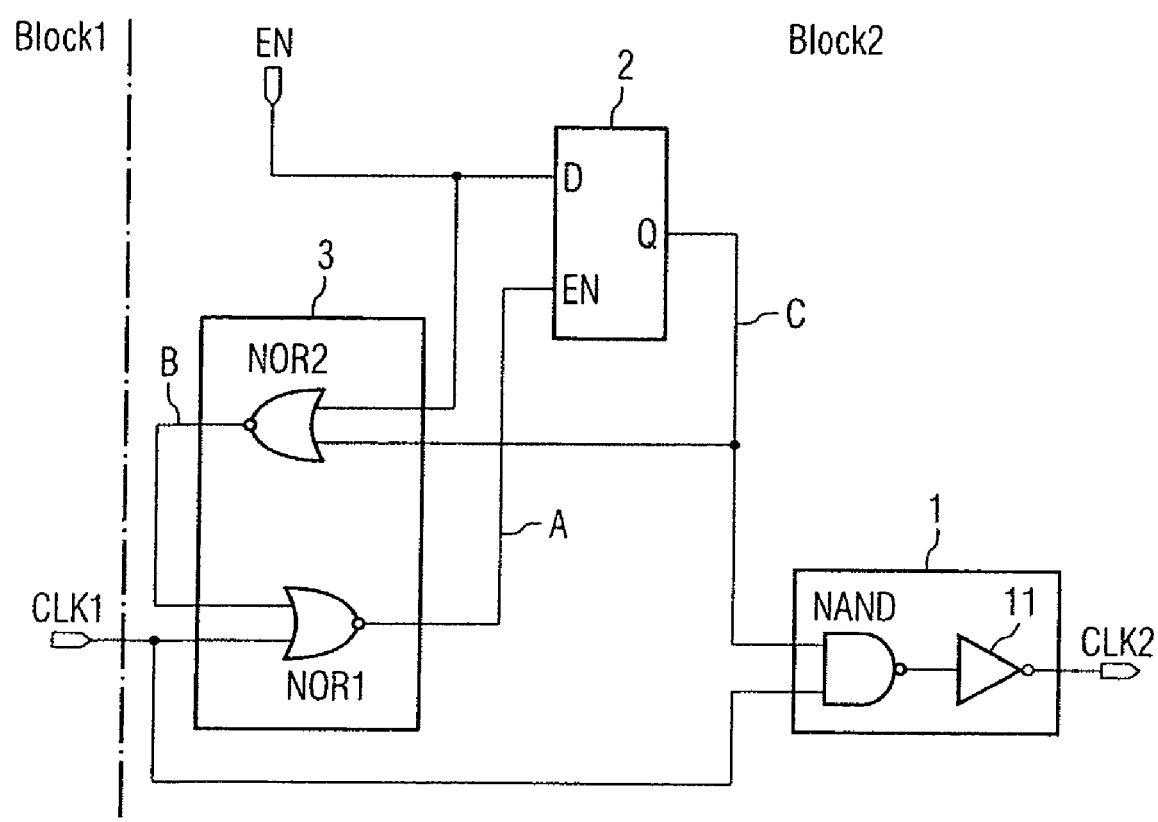
FIG. 3 is a block level schematic diagram illustrating an exemplary embodiment of the clock control cell according to the invention.

FIG. 3 shows an exemplary embodiment of the clock control cell according to the invention. In addition to an input clock signal CLK1, the clock control cell receives an unsynchronized input enable signal EN, and produces an output clock signal or controlled clock signal CLK2.

Figure 1:
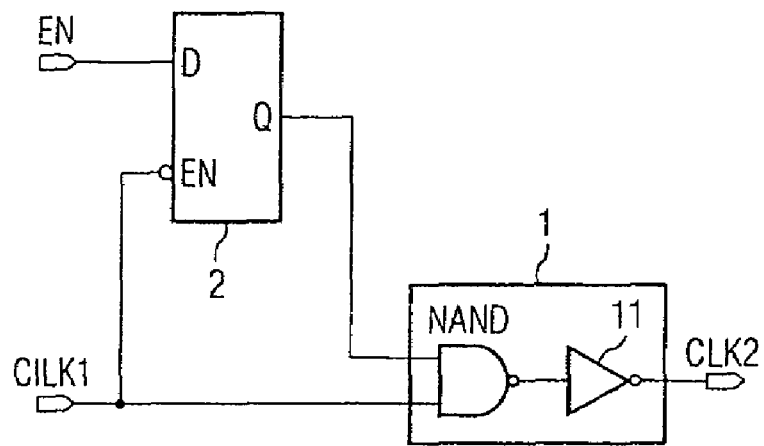
FIG. 1 is a block level schematic diagram illustrating a clock control cell according to the prior art.

The design of the clock control cell is based on the circuit of the clock control cell shown in prior art FIG. 1. Identical components are thus provided with the same reference symbols in FIGS. 1 and 3. In contrast to the clock control cell that is illustrated in prior art FIG. 1, the hold element 2 in the clock control cell according to the invention is preceded by an input stage 3. The input stage 3 is formed from NOR gates NOR1 and NOR2. The inputs of the NOR gate NOR2 are connected to the input enable signal EN and to the output Q of the hold element 2. The output of the NOR gate NOR2 is connected to one input of the NOR gate NOR1. The other input of the NOR gate NOR1 is fed with the input clock signal CLK1. The output of the NOR gate NOR1 is connected to the control input EN of the hold element 2.

A further significant difference between the clock control cells illustrated in FIGS. 1 and 3 is that the NAND gate NAND and the NOR gate NOR1 in the clock control cell each have a unit for suppression of parallel currents. For this purpose, the NAND gate NAND in the present exemplary embodiment is provided by the NAND gate illustrated in FIG. 2a, and the NOR gate NOR1 is formed by the NOR gate illustrated in FIG. 2b.

In order to make it easier to understand the method of operation of the clock control cell as described in the following text, some of the signals that are produced by the components illustrated in FIG. 3 are provided with reference symbols in that figure. For example, the NOR gates NOR1 and NOR2 produce a respective control signal A and B at their outputs. The hold element 2 produces a controlled enable signal C at its output Q. The input clock signal CLK1 is produced by components which are connected upstream of the clock control cell T and are part of a block 1 of an integrated circuit. The clock control cell itself and the components connected downstream from the clock control cell are part of a block 2 of the integrated circuit. The boundary between the blocks 1 and 2 is identified by a dashed line in FIG. 3.

First of all, the situation will be considered in which the block 2 is intended to be supplied with the clock signal CLK1 from the block 1. The input enable signal EN has the value one. The control signal B has the value zero irrespective of the value of the controlled enable signal C. In consequence, the NOR gate NOR1 is sensitive to the input clock signal CLK1, that is to say the NOR gate NOR1 inverts the input clock signal CLK1. The control signal A represents the control signal for the hold element 2. The hold element 2 is actually transparent (passes the EN signal to the output Q as signal C) when the control signal A is one, that is to say when the input clock signal CLK1 is zero. The controlled enable signal C adopts the value one from the input enable signal EN, as a result of which the output stage 1 passes on the input clock signal CLK1, and thus produces the output clock signal CLK2.

The following text is based on the assumption that the output clock signal CLK2 has been switched off, for example because the clock signal from the block 2 and from any blocks which may be connected downstream from it is or are switched off or because the upstream block 1 is supplied with a different supply voltage $V_{DD}$, for example a lower supply voltage $V_{DD}$, or has been switched off entirely. The input enable signal EN is for this purpose switched to zero. If the input clock signal CLK1 is equal to one at this instant, the hold element 2 is not transparent. The controlled enable signal C thus does not immediately adopt the new value of the input enable signal EN. The output of the NOR gate NOR2 remains at zero, since the controlled enable signal C is still one. Thus, since the control signal B is still equal to zero, the NOR gate NOR1 is still sensitive to the input clock signal CLK1, and inverts it. The control signal A is not set to one until after a falling clock edge of the input clock signal CLK1, and the hold element 2 then becomes transparent. However, if the input enable signal EN is switched to zero at a time at which the input clock signal CLK1 is itself zero, then the hold element 2 is transparent. The controlled enable signal C then adopts the value of the new input enable signal EN, and both input signals to the NOR gate NOR2 have the value zero. The control signal B thus becomes one, and the NOR gate NOR1 is insensitive to the input clock signal CLK1. The control signal A then permanently assumes the value zero, irrespective of the input clock signal CLK1. The hold element 2 is thus permanently non-transparent for the input enable signal EN. The controlled enable signal C equal to zero is applied to the NAND gate NAND in the output stage 1. The control signal B at the NOR gate NOR1 in the input stage 3 is still equal to one. The current paths are thus interrupted in the logic elements NOR1, NAND to which the input clock signal CLK1 is applied.

If the input clock signal CLK1 is masked out by a clock control cell according to the invention, then the clock input of block 2 is insensitive to undefined voltage levels of the input clock signal CLK1. Parallel currents and short-circuit currents are suppressed, irrespective of what voltage level the input clock signal CLK1 assumes, and irrespective of the supply voltage for the block 1.

The following text is based on the assumption that the clock signal CLK2 for the block 2 has been activated again. The input enable signal EN is set to one, and the control signal B is switched to zero. In consequence, the NOR gate NOR1 is once again sensitive to the input clock signal CLK1 and the hold element 2 becomes transparent when the input clock signal CLK1 is zero, or otherwise after the next (falling) edge of the input clock signal CLK1. The controlled enable signal C adopts the new value one of the input enable signal EN, and the input clock signal CLK1 is passed on in the output stage 1 to the output clock signal CLK2. The control signal B is not changed by the new value of the controlled enable signal C, and the NOR gate, NOR1 still remains sensitive to the input clock signal CLK1.

The clock control signal according to the invention can advantageously be used in particular when a clock path passes through a number of blocks and the various blocks are possibly supplied with different voltages $V_{DD}$. Clock control cells are in this case preferably located at the block boundaries.

While the invention has been illustrated and described with respect to one or more implementations, alterations and/or modifications may be made to the illustrated examples without de-parting from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A clock control cell for production of an output clock signal from an input clock signal, comprising:
   a hold element configured to produce a controlled enable signal from an input enable signal;
   an output stage configured to produce the output clock signal from the input clock signal and the controlled enable signal;
   a signal level converter coupled to the hold element, and configured to convert an input signal to an output signal at predetermined signal levels, wherein the input clock signal comprises the input signal of the signal level converter, wherein the signal level converter comprises a suppression unit configured to suppress parallel currents within the signal level converter; and
   an input stage which comprises the signal level converter and a control unit configured to control the suppression unit as a function of the input enable signal.

2. The clock control cell of claim 1, wherein the control unit additionally is configured to control the suppression unit as a function of the controlled enable signal.

3. The clock control cell of claim 1, wherein the output signal from the signal level converter is operable to enable the hold element to output the controlled enable signal.

4. The clock control cell of claim 1, wherein the output stage comprises a further suppression unit configured to suppress parallel currents within the output stage.

5. The clock control cell of claim 4, wherein a control signal operable to activate the further suppression unit in the output stage is the controlled enable signal.

6. The clock control cell of claim 1, wherein the input clock signal is applied exclusively to the signal level converter having the suppression unit.

7. The clock control cell of claim 1, wherein the suppression unit comprises a controllable switching unit configured to interrupt or prevent any current flow between two fixed potentials of different values.

8. The clock control cell of claim 1, wherein the output clock signal comprises a transition edge that is exclusively positioned synchronously with respect to the input clock signal.

9. The clock control cell of claim 1, wherein the output clock signal assumes a constant signal level following a next transition edge of the input clock signal, when the input enable signal transitions low to switch off the clock.

10. The clock control cell of claim 4, wherein the further suppression unit comprises:
   two NMOS transistors connected in series between an output node and a circuit ground potential, wherein control gates of the NMOS transistors are connected to two input nodes, respectively; and
   two PMOS transistors connected in parallel between the output node and a supply voltage potential, wherein control gates of the PMOS transistors are connected to the two input nodes, respectively, and
   wherein one of the NMOS transistors operates to suppress current flow from the supply voltage potential to the ground potential when a voltage at a corresponding input node is low.

11. A clock control cell for production of an output clock signal from an input clock signal, comprising:
   a hold element configured to produce a controlled enable signal from an input enable signal;
   an output stage configured to produce the output clock signal from the input clock signal and the controlled enable signal;
   a signal level converter coupled to the hold element, and configured to convert an input signal to an output signal at predetermined signal levels, wherein the input clock signal comprises the input signal of the signal level converter; and
   an input stage which comprises the signal level converter and a control unit configured to control the suppression unit as a function of the input enable signal, wherein the signal level converter or the control unit comprise a NOR gate.

12. A clock control cell for production of an output clock signal from an input clock signal, comprising:
   a hold element configured to produce a controlled enable signal from an input enable signal;
   an output stage configured to produce the output clock signal from the input clock signal and the controlled enable signal;
   a signal level converter coupled to the hold element, and configured to convert an input signal to an output signal at predetermined signal levels, wherein the input clock signal comprises the input signal of the signal level converter, wherein the signal level converter comprises a suppression unit configured to suppress parallel currents within the signal level converter, and wherein the suppression unit comprises:
      two PMOS transistors connected in series between a supply voltage potential and an output node, wherein control gates of the PMOS transistors are connected to two input nodes, respectively; and
      two NMOS transistors connected in parallel between the output node and circuit ground potential, wherein control gates of the NMOS transistors are connected to the two input nodes, respectively, and
      wherein one of the PMOS transistors operates to suppress current flow from the supply voltage potential to the ground potential when a voltage at a corresponding input node is high.

* * * * *